(12) United States Patent
Habib et al.

(10) Patent No.: US 9,848,138 B2
(45) Date of Patent: Dec. 19, 2017

(54) ELECTRONIC CHARGE INJECTION CIRCUIT FOR RADIATION DETECTOR

(71) Applicants: COMMISSARIAT A L'ENERGIE ATOMIQUE ET AUX ENERGIES ALTERNATIVES, Paris (FR); TRIXELL, Moirans (FR)

(72) Inventors: Amr Habib, Marseilles (FR); Marc Arques, Grenoble (FR)

(73) Assignees: COMMISSARIAT A L'ENERGIE ATOMIQUE ET AUX ENERGIES ALTERNATIVES, Paris (FR); TRIXELL, Moirans (FR)

( * ) Notice: Subject to any disclaimer, the term of this patent is extended or adjusted under 35 U.S.C. 154(b) by 0 days.

(21) Appl. No.: 15/032,562

(22) PCT Filed: Oct. 29, 2014

(86) PCT No.: PCT/EP2014/073229
§ 371 (c)(1),
(2) Date: Apr. 27, 2016

(87) PCT Pub. No.: WO2015/063156
PCT Pub. Date: May 7, 2015

(65) Prior Publication Data
US 2016/0295137 A1   Oct. 6, 2016

(30) Foreign Application Priority Data

Oct. 29, 2013  (FR) ...................................... 13 60551

(51) Int. Cl.
*H04N 5/355* (2011.01)
*G01T 1/20* (2006.01)
(Continued)

(52) U.S. Cl.
CPC ......... *H04N 5/3559* (2013.01); *G01T 1/2018* (2013.01); *G01T 1/24* (2013.01); *H03K 4/023* (2013.01); *H04N 5/374* (2013.01)

(58) Field of Classification Search
CPC ........... H04N 5/3559; G01T 1/17; G01T 1/24; G01T 1/2018; H03K 4/023
See application file for complete search history.

(56) References Cited

U.S. PATENT DOCUMENTS 4,728,828 A    3/1988  Goodnough
5,652,430 A    7/1997  Lee
(Continued)

FOREIGN PATENT DOCUMENTS

FR         2 977 413 A1     1/2013

*Primary Examiner* — David Porta
*Assistant Examiner* — Faye Boosalis
(74) *Attorney, Agent, or Firm* — Baker & Hostetler LLP

(57) ABSTRACT

An electronic read circuit for a radiation detector comprises: an element sensitive to the radiation, an injection circuit, able to inject a charge at one terminal of the sensitive element, the injection circuit extending between at least one input terminal and one output terminal, the output terminal being able to be connected to the sensitive element, the injection circuit being able to produce a charge under the effect of a trigger pulse. The injection circuit is able to inject a first charge when an input terminal is connected to a first input potential and a second charge when an input terminal is connected to a second input potential. The circuit comprises means for storing a difference between an output potential of the injection circuit, called equilibrium potential, and a reference potential, such that the second charge depends on the second input potential and on the equilibrium potential.

14 Claims, 7 Drawing Sheets

(51) Int. Cl.
  *G01T 1/24* (2006.01)
  *H03K 4/02* (2006.01)
  *H04N 5/374* (2011.01)

(56) References Cited

U.S. PATENT DOCUMENTS

| | | |
|---|---|---|
| 6,670,598 B1 | 12/2003 | Hosier et al. |
| 2007/0285300 A1 | 12/2007 | Peizerat |
| 2010/0194951 A1 | 8/2010 | Peizerat et al. |

ELECTRONIC CHARGE INJECTION CIRCUIT FOR RADIATION DETECTOR

CROSS-REFERENCE TO RELATED APPLICATIONS

This application is a National Stage of International patent application PCT/EP2014/073229, filed on Oct. 29, 2014, which claims priority to foreign French patent application No. FR 1360551, filed on Oct. 29, 2013, the disclosures of which are incorporated by reference in their entirety.

FIELD OF THE INVENTION

The invention relates to an electronic circuit for a radiation detector suitable for quantifying a radiation of photons received by means of a counter-charge injection circuit. It relates in particular to the matrix radiation detectors intended for X or gamma ray radiological imaging, comprising a matrix of pixels of CMOS technology associated with a structure for converting X or gamma rays into electrical charges.

BACKGROUND

A matrix radiation detector comprises a matrix of pixels and an electronic circuit forming reading means. Each pixel comprises a photosensitive element generating electrical charges in proportion to the received quantity of photons. These electrical charges, also called photocharges, are processed by the reading means in order to supply an information item representative of the quantity of photons received by each photosensitive element. The use of the CMOS technology has made it possible to integrate the reading means in each pixel. Thus, the electrical charges can be converted into digital signals within the pixels themselves to simplify the transfer of the detection result to outside the matrix. One current solution for producing the reading means is to use a circuit that operates by integration of the electrical charges. This integration circuit comprises an integration capacitance receiving the charges from the photosensitive element, a threshold comparator, a counter and a counter-charge injection circuit. During an exposure phase, the arrival of electrical charges on the integration capacitance brings about a drop in the voltage at its terminals. During an electrical charge reading phase, the threshold comparator switches over a certain number of times, as long as the voltage at the terminals of the integration capacitance is below a threshold voltage. Each switching over of the comparator increments the counter by one unit and commands the injection circuit to inject a packet of counter-charges, the quantity $Q_0$ of which is gauged. The counter is thus incremented by the number of packets of charges necessary to bring a voltage above the threshold voltage at the terminals of the integration capacitance. Generally the injection of counter-charges is performed as the photocharges are collected, a counter determining the number of switchovers of the comparator, in order to estimate the total quantity of charges injected. The reading then corresponds to the reading of the content of the counters. The number of incrementations of the counter provides a numeric value representative of the quantity of photons received by the photosensitive element.

The counter-charge injection circuit is a critical element of the integration circuit. In effect, the accuracy of the measurement relies on the gauging of the quantity $Q_0$ of counter-charges. On the one hand, the quantity $Q_0$ of counter-charges has to be relatively small since it corresponds to the charge quantification pitch; on the other hand, this quantity has to be identical for each packet of counter-charges since it quantifies the charges received by the integration capacitance.

Now, in the current counter-charge injection circuits, the quantity of charges injected on each switchover of the comparator can fluctuate. In effect, these circuits comprise field-effect transistors, the channels of which are effected by a random noise called RTS which stands for "random telegraph signal". The random nature of this noise influences the quantity of counter-charges injected: the injections are affected by this noise, all differently to one another. So, when trying to estimate the total charge injected by a certain number of injections, exactly how the injections have been affected is unknown.

For example, a counter-charge injection circuit often comprises two field-effect transistors (FET) connected in series and a capacitor connected between the link point of the transistors and a fixed voltage, for example the ground. A first transistor makes it possible to charge the capacitor to a first voltage value, called charge voltage, controlled by the gate voltage of this transistor. The second transistor makes it possible to discharge the capacitor to a second voltage value, called discharge voltage, controlled by the gate voltage of this transistor. The quantity $Q_0$ of counter-charges injected from the capacitor to the integration capacitor of the integration circuit is a function of the value of the capacitance of the capacitor and of the difference between the charge and discharge voltages. However, the charge and discharge voltages cannot be directly deduced from the gate voltages of the transistors. The charge and discharge voltages correspond to the internal potentials of the transistors, which are not known accurately because of the RTS noise due to the trapping of the charges in the channel of each transistor. This RTS noise is all the greater when the components have dimensions reduced in order to generate relatively low quantities $Q_0$ of counter-charges. In practice, this RTS noise modifies the value of the quantity $Q_0$ by a few percentage points. This modification is reflected directly on the assessment of the quantity of photons received, and therefore on the quality of the image obtained. Now, such an error is generally detrimental, particularly in the field of medical imaging.

Solutions for remedying the abovementioned drawbacks do exist. They consist in accurately determining the quantity of counter-charges injected to assess the quantity of charges generated by a photosensitive element. Thus the quantity of charges injected on each switchover of the comparator is controlled. The measurement of the total quantity of the charge collected by a detector is then improved, which increases the accuracy of the measurement.

This technique works well when the quantity $Q_0$ of counter-charges is significant. However, when trying to access smaller charges $Q_0$ (typically of the order of 100 elementary charges injected, that is to say electrons or holes, or less), drawbacks appear. For example, the injected charge $Q_0$ can depend on a potential difference that is variable because of the technological dispersions. The value of this potential difference has to be greater than its variation for the dispersions of $Q_0$ to be acceptable. In other words, the variation of the potential difference has to be negligible compared to the potential difference itself. Furthermore, to obtain small $Q_0$ values, small transistors are used which are more sensitive to the RTS noise. This noise generates variations of threshold voltages, of variable durations. Correcting these variations requires complex devices.

This problem is mentioned in the patent application FR2977413.

SUMMARY OF THE INVENTION

The invention aims to mitigate all or some of the above-mentioned problems by proposing an electronic circuit for radiation detector making it possible to both control the quantity of charges injected on each switchover of the comparator and to deliver small quantities of counter-charges.

To this end, the subject of the invention is an electronic circuit for radiation detector comprising:
  a radiation-sensitive element,
  an injection circuit, suitable for injecting a charge at a terminal of the sensitive element, the injection circuit extending between at least one input terminal and one output terminal, the output terminal being suitable for being connected to said sensitive element, the injection circuit being suitable for producing a charge under the effect of a trigger pulse,
  a comparator having a switchover potential, with a first input receiving a threshold potential and a second input suitable for being connected to an integration node that can store electrical charges generated by the sensitive element on reception of the radiation, the charges bringing about a variation of a potential at the integration node, the injection circuit being suitable for injecting charges at the integration node on each switchover of the comparator,
characterized in that the injection circuit is suitable for injecting a first charge when an input terminal is connected to a first input potential and a second charge when an input terminal is connected to a second input potential,
and in that the circuit comprises a means for storing a difference between an equilibrium potential and a reference potential, the equilibrium potential corresponding to an output potential of the injection circuit after one or more injections of the first charge, the reference potential being a fixed potential, and the injection circuit is suitable for injecting a second charge dependent on the second input potential and on said equilibrium potential.

Another subject of the invention is a method implementing the electronic circuit, characterized in that it comprises an initialization phase, comprising the following steps:
  connection of an input terminal of the injection circuit to a first potential
  injection of a first charge on the output terminal of the injection circuit
  storage of a difference between an equilibrium potential and a reference potential, the equilibrium potential corresponding to an output potential of the injection circuit after one or more injections of the first charge, the reference potential being a fixed potential
  if necessary, setting of the integration node at a trigger potential, corresponding to a threshold of the potential of the integration node beyond which the injection circuit injects charges
  connection of an input terminal of the injection circuit to a second potential, such that the injection circuit delivers a second charge as a function of the difference between the potential of the integration node and the trigger potential.

According to one embodiment, the equilibrium potential corresponds to the potential at the integration node at the end of an initialization phase. This equilibrium potential then constitutes the trigger potential, below or above which the injection circuit delivers a second charge.

BRIEF DESCRIPTION OF THE DRAWINGS

The invention will be better understood and other advantages will emerge on reading the detailed description of an embodiment given by way of example, the description being illustrated by the attached drawing in which.

For clarity, the same elements will bear the same references in the different figures.

DETAILED DESCRIPTION

Figure 1:
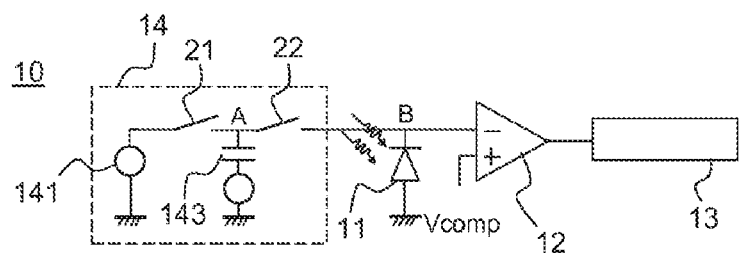
FIG. 1 represents an electrical circuit diagram of a pixel in a radiation detector according to the state of the art.

FIG. 1 represents the circuit diagram of an electronic circuit of a pixel 10 in a matrix radiation detector according to the prior art (as described for example in the patent application FR2977413). Each pixel 10 forms a photosensitive point of the matrix detector. The electronic circuit comprises a radiation-sensitive element 11, a comparator 12 having a switchover potential $V_{comp\_bascul}$ with a first input receiving a threshold potential $V_{comp}$ and a second input for being connected to an integration node B linked to the cathode of the sensitive element 11.

The sensitive element 11 has a stray capacitance. Electrical charges generated by the sensitive element 11 on reception of the radiation can be stored by the stray capacitance of the sensitive element 11. The charges collected bring about a variation of the potential on the integration node B, called integration potential. The sensitive element 11 can be a photodiode or a phototransistor or, more generally, any photosensitive element generating electrical charges in proportion to the quantity of photons that it receives. The photons considered have, for example, a wavelength in the visible range, in the infrared range or in the X-ray range. In the latter case, either the photosensitive element directly produces electrical charges under the effect of an X radiation, or it is sensitive to the visible radiation, a scintillator then being interposed between the X-radiation source and the photosensitive element.

The sensitive element 11 has a stray capacitance C_det used as integration capacitance for storing the electrical charges generated during an exposure phase. The stray capacitance C_det of the sensitive element is generally sufficient. Nevertheless, a capacitor could be connected in parallel to the sensitive element to increase the integration capacitance, as detailed hereinbelow. A terminal of the sensitive element 11 is linked to a fixed potential. It is for example connected to the electrical ground. The threshold comparator 12 receives, on a positive input, the threshold potential Vcomp. The negative input is connected to the integration node of the sensitive element 11.

The electronic circuit comprises a charge injection circuit 14, suitable for injecting charges at the integration node B. The injection circuit 14 can also be called injector. The injection circuit 14 is suitable for injecting charges at the integration node B on each switchover of the comparator 12. Depending on the operation of the detector, these charges are either positive (when the detector collects electrons), or negative (when the detector collects holes).

When the integration potential $V_B$ deviates from a threshold, called trigger potential, the injection circuit 14 is configured to inject charges at the integration node B. When the detector 11 collects electrons, the integration potential $V_B$ becomes lower than the trigger potential. The comparator 12 switches over, which results in an injection of charges, called "counter-charges", at the integration node B. The term counter-charges describes the fact that the charges injected are intended to bring the integration potential $V_B$ above the trigger potential.

Similarly, when the detector 11 collects positive charges (also called holes), the integration potential $V_B$ becomes greater than the trigger potential. The comparator 12 switches over, which results in an injection of charges intended to bring the integration potential $V_B$ below the trigger potential.

Thus, generally, the charge injection circuit 14 is suitable for injecting charges toward the integration node B as a function of a comparison between the integration potential $V_B$ and the trigger potential.

The injection circuit 14 operates in pulse mode: it delivers a determined quantity Q0 of charges under the action of a pulse. The term injection cycles is also used. As long as the integration potential $V_B$ has not crossed the trigger potential, the injection circuit 14 successively injects said quantity of charges Q0.

In the example represented in FIG. 1, the trigger potential is linked to the potential $V_{comp}$ of the input of the comparator 12, to within the offset of the comparator. When the integration potential $V_B$ is lower than the switchover potential of the comparator 12, called $V_{comp\_bascul}$, the comparator 12 switches over, which results in successive injections of counter-charges, until the integration potential $V_B$ crosses $V_{com\_bascul}$. Thus, in this example, the trigger potential corresponds to $V_{comp\_bascul}$.

The electronic circuit comprises a counter 13 connected at the output of the comparator 12 so as to count the number of switchovers of the comparator, that is to say count the number of charge injection cycles. Elements for formatting the signal from the comparator 12 can be interposed between the latter and the counter 13.

The threshold comparator 12, the counter 13 and the injection circuit 14 form an electronic circuit making it possible to read the sensitive element 11.

The counter-charge injection circuit 14 comprises two switches 21 and 22 driven respectively by Phi_1 and Phi_2, a voltage source 141 for injection voltage V_inj, a capacitor 143 of injection capacitance C_inj. The switch 21, the switch 22 and a terminal of the capacitor 143 are linked at a point A, called node of the counter-charge injection circuit. The first switch 21 makes it possible to connect the voltage source 141 and the point A previously defined. The first switch 21 makes it possible to form a charge at the node A of the charge injection circuit. This will be called precharge switch.

The switch 22 makes it possible to connect the point A to the cathode of the sensitive element 11, so as to be able to inject counter-charges therein. Also, the switch 22 can be called transfer switch. It must be specified that the cathode of the sensitive element 11 corresponds also to the point where the charges generated by the interactions of the radiation in the detector build up. This point can be called integration node B of the pixel. In other words, the node B is a point of connection between the sensitive element 11 and its electronic reading circuit. It can receive, on the one hand, electrical charges from the sensitive element 11 when it is exposed and, on the other hand, electrical counter-charges from the counter-charge injection circuit 14.

The collection of electrical charges and the injection of counter-charges on the node B bring about a variation of the potential at the integration node B. By way of example, it is considered that, upon the reception of photons, the sensitive element 11 generates negative charges (electrons) stored on its cathode. These negative charges bring about a drop in the potential at the node B. When the potential at the node B becomes lower than the switchover potential of the comparator $V_{comp\_bascul}$, the comparator 12 switches over. Each switchover is counted by the counter 13.

The principle of operation of the counter-charge injection circuit 14 is as follows. The injection potential V_inj is chosen greater than the threshold potential $V_{comp}$ by delta_V_inj. In other words, the injection potential V_inj of 141 is equal to the sum of the threshold potential $V_{comp}$ and of delta_V_inj. The point A is precharged to the potential V_inj by a pulse Phi_1 from the switch 21. When the potential $V_B$ at the integration node B passes below the switchover potential of the comparator, the switch 22 is switched on by a pulse Phi_2. A charge Q0 is then injected on the integration node B. The quantity Q0 of counter-charges injected on the integration node B and therefore on the sensitive element 11 is C_inj×delta_V_inj×C_det/(C_det+C_inj). The precharge and injection cycle is repeated as many times as necessary, that is to say until the potential at the node B reaches the switchover potential of the comparator. These cycles are counted in the counter. It should be noted that the capacitance of the sensitive element 11 can be low enough for the injection of a single counter-charge to bring the potential of the node B to the switchover potential, which results in the switchover of the comparator 12.

Now assume that C_inj×C_det/(C_det+C_inj) is equal to a femto Farad (fF), which is already lower than what is controlled generally in CMOS design. If the aim is to have a value of Q0 equal to 100 elementary charges injected, then delta_V_inj must=100×q/1 fF=16 mV.

The comparators of the different pixels of the imager are subject to variations of the threshold voltages, of the order of 10 mV, and which vary from one pixel to another notably because of the technological dispersions, the temperature and the aging of the imager. It is therefore very difficult, even impossible, to control a low charge Q0.

Moreover, there are stray capacitances in the setup, particularly with the Phi_1 and Phi_2 commands of the switches 21 and 22. If it is assumed that Phi_1 and Phi_2 are pulsed between 0 and 1.2V and that the stray capacitances are also of 1 femto Farad, then the stray charges injected are 1.2×1 fF/q, i.e. 7500 elementary charges injected.

The electrical circuit diagram of a pixel in a radiation detector according to the prior art is not suited to producing small counter-charges Q0. The invention presented aims to propose a functional electrical circuit diagram with small counter-charges Q0.

Figure 2A:
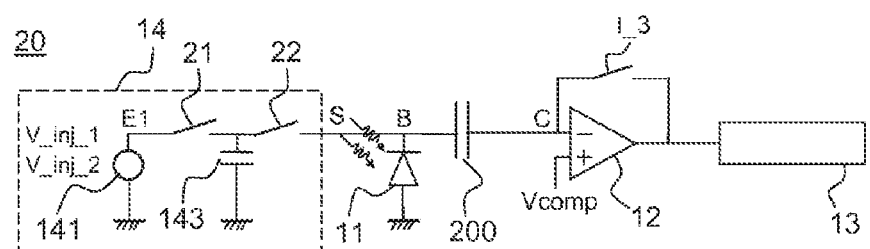
FIGS. 2A, 2B, 2C represent embodiments of an electrical circuit diagram of a pixel in a radiation detector according to the invention.

FIG. 2A represents a first embodiment of the electronic circuit of a radiation detector according to the invention. The electrical circuit diagram of the pixel 20 comprises the same elements as the electrical circuit diagram of the pixel 10 represented in FIG. 1. According to the invention, the injection circuit 14 is suitable for injecting a charge at a terminal of the sensitive element (11). The injection circuit 14 extends between at least one input terminal E1 and one output terminal S, the output terminal S being suitable for being connected to said sensitive element 11. The injection circuit 14 is suitable for producing a charge under the effect of a trigger pulse. According to this embodiment, the injection circuit 14 is suitable for injecting a first charge when an input terminal E1 is connected to a first input potential V_ing_1 and a second charge when an input terminal E1 is connected to a second input potential V_inj_2. The electronic circuit comprises a means for storing a difference between an output potential Vs of the injection circuit 14, called equilibrium potential $V_{equ}$, and a reference potential and such that the second charge depends on the second input potential and on said equilibrium potential $V_{equ}$. In this example, the reference potential corresponds to the switchover potential of the comparator.

The injection circuit 14 is linked to the integration node B and is suitable for delivering a charge Qtot. The electronic circuit of the pixel 20 further comprises means for setting the comparator 12 at the switchover voltage when the integration node B reaches an equilibrium potential, denoted $V_{equ}$, during an initialization phase, and a storage means connected to an input of the comparator 12 suitable for storing the switchover voltage of the comparator 12.

In FIG. 2A, the storage means comprises a second capacitor 200 linked to the second input of the comparator 12, the inverting input, and a switch I_3 connected between the inverting input of the comparator 12, to which the second capacitor 200 is linked, and the output of the comparator 12. The capacitor 200 of capacitance $C_L$ is connected between the integration node B and a point C corresponding to the inverting input of the comparator 12. The capacitor 200 must have a capacitance $C_L$ that is high enough compared to the stray capacitances in order for the voltage variations at the integration node B to be, first of all, transmitted to the second input of the comparator 12.

In this first variant, the injection circuit 14 comprises an input terminal E1, suitable for being connected to a first potential (V_inj_1) or to a second potential (V_inj_2). It also comprises an output terminal S, which corresponds here to the integration node B of the detector 11.

When the input terminal E1 is connected to the first potential (V_inj_1), the injection circuit 14 delivers a first charge Q1. When the input terminal E1 is connected to the second potential (V_inj_2), the injection circuit 14 delivers a second charge Q2.

In a first initialization phase, the input terminal E1 of the injection circuit 14 is connected to the first potential V_inj_1. The two switches 21 and 22 are in the on state. The voltage at the terminals of the sensitive element 11 is therefore equal to V_inj_1. The switch I_3 is also in the on state. The comparator 12 is close to its switchover potential $V_{comp\_bascul}$. The switchover potential corresponds to the threshold potential Vcomp, to within the offset of the comparator 12. The capacitance $C_L$ of the capacitor 200 is therefore charged to a voltage equal to the difference between the first injection potential (V_inj_1) and the switchover potential of the comparator 12, i.e. (V_inj_1−$V_{comp\_bascul}$). The switch I_3 is then switched off. The term "switch off" denotes the fact that the switch is opened. The charge on the capacitor 200 is then fixed.

Thus, the voltage at the terminals of the link capacitance $C_L$ is fixed at a value taking into account the first potential (V_inj_1) and the switchover potential of the comparator ($V_{comp\_bascul}$), the latter being able to be likened to a fixed reference potential. In effect, it depends on the threshold potential (non-inverting input potential) and on the offset of the comparator 12. Each time the potential of the integration node B reaches the first injection potential V_inj_1, the inverting input of the comparator 12 is at the switchover potential $V_{comp\_bascul}$.

When the switch I_3 is switched off, the capacitance constitutes a means for storing a difference between the potential at the integration node, which is also the potential of the output terminal S of the injection circuit 14, and the reference potential $V_{comp\_bascul}$. It will be recalled that the output terminal S and the integration node B are one and the same.

At the end of the initialization phase, the potential difference stored at the terminals of the capacitance corresponds to the difference between a potential at the output of the injector, called equilibrium potential $V_{equ}$ (with, in this example, $V_{equ}$=V_inj_1) and the reference potential $V_{comp\_bascul}$.

In a second phase of use of the detector, the switches 21 and 22 are initially switched off. The injection potential V_inj is then equal to the second potential V_inj_2, with $$V\_inj\_2 - V\_inj\_1 = \text{delta}\_V\_inj.$$

The first switch 21 is then activated by a pulse, to precharge the node A of the injection circuit 14 at the second injection potential V_inj_2.

When an interaction occurs in the detector 11, the charge collected by the detector modifies the potential $V_B$ at the integration node B. Each time the potential at the integration node B reaches the injection potential V_inj_1, the input C of the comparator 12 is at its switchover potential. A counter-charge injection cycle is triggered: when the potential of the input C of the comparator 12 is below the switchover potential $V_{comp\_bascul}$, the switch 22 is switched on by a pulse of Phi_2. A second charge Q2 is then injected on the integration node B. The quantity Q2 of counter-charges injected on the integration node B and therefore on the sensitive element 11 is $$Q2 = \frac{(C\_inj \times \text{delta}\_V\_inj \times C\_det)}{(C\_det + C\_inj)}.$$

Thus, the second charge depends on the second input potential V_inj_2 of the injection circuit 14, and on the output potential V_inj_1 stored while the injection circuit 14 delivers a first charge Q1.

The assembly formed by the two switches 21 and 22 and the capacitor 143 of injection capacitance C_inj can be considered as a resistance with switched capacitances: the quantity of charge delivered is proportional to the potential difference between the input potential (V_inj_1 or V_inj_2) and the output potential.

The precharge and injection cycle is repeated as many times as necessary, that is to say until the potential at the node B reaches or exceeds an equilibrium potential $V_{equ}$, the latter being equal to V_inj_1 in this embodiment, the effect of the stray charges having been disregarded. In other words, the injection circuit 14 injects charges as a function of the value of the potential at the integration node B, and the switches 21, 22 of the injection circuit 14 are activated a plurality of times, dependent on the quantity of charge collected by the detector upon the interaction. These cycles are counted in the counter 13, so as to estimate the total charge collected.

The introduction of the capacitor 200 makes it possible to overcome the variations of switchover voltage of the comparator 12. It also makes it possible to choose the operating potential $V_B$ of the sensitive element 11 independently of the switchover potential of the comparator 12, which is particularly advantageous when the sensitive element 11 and the comparator 12 do not have the same operating potential optima.

By contrast, the presence of stray capacitances in the electronic circuit results in a much greater injection of charges Q2 which is wanted.

In the absence of deliberate injection, that is to say if the second injection potential V_inj_2 is chosen to be equal to the first injection potential V_inj_1, the stray couplings create a stray injection Qpar. Thus, on each injection cycle of the switches 21 and 22, a quantity Qpar is injected on the integration node B while delta_V_inj=0. Consequently, the potential of the integration node B trends positively if Qpar is positive and negatively if Qpar is negative.

According to a second embodiment, the aim is to overcome the effect of stray charges, in order to control the quantity of charges injected, on each cycle, during the operation of the detector. According to this embodiment, during the initialization phase, a number of injections of first charges Q1 are performed in succession.

On each injection, a quantity of stray charges Qpar is injected at the integration node B, this quantity being positive or negative. Upon the next injection, if the potential of the integration node B has become positive (respectively negative) relative to the first potential V_inj_1, that is to say relative to the precharge potential of the point A, then, when the switch 22 switches on, a positive charge $Q_{echap}$ (respectively negative) escapes from B to go to A in order to oppose the growth (respectively decay) of the potential of the integration node B. The charges escaping from the integration node B to go to the point A are all the greater as the voltage of the integration node B increases (respectively decreases).

In the presence of stray coupling capacitances, there is necessarily an equilibrium potential at the output of the injector S, denoted $V_{equ}$, for which the influx of charges Qpar by the stray is equal to the escape of the charges $Q_{echap}$ when the switch 22 is in the on state. When this equilibrium potential is reached, the charge injected is nil and does not fluctuate because of the stray charges. The expression nil injected charge should be understood to mean a charge below a predetermined threshold, below which the injection of charge is considered to be negligible.

The first charge Q1 injected can be expressed by the relationship:

$$Q1 = (V\_inj\_1 - Vs) \times (C\_inj \times C\_det)/(C\_det + C\_inj) + Qpar,$$

Vs corresponding to the output potential of the injector ($V_S = V_B$).

When Vs reaches the equilibrium potential $V_{equ}$, Q1=0, therefore $$Qpar = -(V\_inj\_1 - Vequ) \times (C\_inj \times C\_det)/(C\_det + C\_inj).$$

To take account of establishment of such an equilibrium potential, the principle of operation of the circuit comprises an initialization phase comprising the following steps:
- connection of an input terminal of the injection circuit to a first potential,
- injection of a first charge on the output terminal of the injection circuit,
- storage of a difference between an output potential (Vs) of the injection circuit (14), called equilibrium potential ($V_{equ}$), and a reference potential $V_{ref}$, this storage being performed preferably when said first charge, delivered by the injection circuit, is below a predetermined threshold,
- if necessary, setting of the integration node to a trigger potential,
- connection of an input terminal of the injection circuit to a second potential, such that the injector delivers a second charge as a function of the difference between the potential of the integration node and the trigger potential.

According to this embodiment, the reference potential $V_{ref}$ is a fixed potential, corresponding to the switchover potential $V_{comp\_bascul}$ of the comparator.

The aim of the initialization phase thus defined is to take account of all the strays and to cancel them. The injection potential V_inj is given the value V_inj_1. In other words, the input terminal E1 of the injection circuit 14 is connected to the first potential V_inj_1, so as to inject a first charge Q1 at the integration node B. The switch I_3 is in the on state. The input C of the comparator 12 is at its switchover potential $V_{comp\_bascul}$, that is to say V_C is equal to $V_{comp\_bascul}$. The switches 21 and 22 are activated in succession a sufficient number of times for the potential of the integration node B, which corresponds also to the output potential of the injection circuit 14, to reach the equilibrium potential $V_{equ}$ described previously.

Theoretically, the more the number of closure and opening cycles of the two switches 21 and 22 increases, the more the potential at the integration node B asymptotically approaches the equilibrium potential Vequ. Typically, pulses are repeated between 10 and 100 times, over a duration of approximately 50 µs. The equilibrium potential $V_{equ}$ is reached when the charge injected is considered to be nil, the potential of the integration node B then being equal to $V_{equ}$. At that moment, this equilibrium potential $V_{equ}$ no longer changes between two successive charge injections.

The electronic circuit comprises a means for storing the potential difference between the equilibrium potential $V_{equ}$ and a reference potential $V_{ref}$, corresponding in this example to the switchover potential of the comparator 12, after a predetermined number of trigger pulses. In practice, the equilibrium potential is stored when it is estimated that it is reached to within an acceptable error. When it is reached, the output potential of the injection circuit no longer changes significantly: the charge delivered, on each charge injection, is then nil to within a predetermined threshold. The predetermined number of trigger pulses is determined either experimentally, or by simulations.

The initialization phase is completed by the storage, at the terminals of the capacitor 200 of link capacitance $C_L$, of a difference between an output potential Vs of the injection circuit 14, called equilibrium potential $V_{equ}$, and the reference potential $V_{ref}$. This storage is obtained by opening the switch I_3, such that the charge on the capacitor 200 is fixed and equal to $V_{equ}$-$V_{comp\_bascul}$. This charge takes account not only of the variations of switchover voltage of the comparator 12, but also the equilibrium voltage of the integration node B linked to the stray couplings.

The rest of the operation of the circuit is identical to the case presented previously: the input terminal E1 of the charge injection circuit 14 is connected to a second potential V_inj_2, such that, on each charge injection, the charge injection circuit 14 injects a second charge Q2, $$Q2=(V\_inj\_2-Vequ)\times(C\_inj\times C\_det)/(C\_det+C\_inj)+Qpar,$$

in which Qpar represents the stray charge.
Now $$Qpar=-(V\_inj\_1-Vequ)\times(C\_inj\times C\_det)/(C\_det+C\_inj).$$

Therefore $$Q2=(V\_inj\_2-V\_inj\_1)\times(C\_inj\times C\_det)/(C\_det+C\_inj).$$

It will be noted that the quantity of counter-charges injected Q0=Q2 is independent of Qpar.

Each time the potential at the integration node deviates from the equilibrium potential $V_{equ}$, and therefore the comparator 12 is at its switchover potential, a counter-charge injection cycle is triggered, the switches 21 and 22 being actuated. A charge Q2 is then injected on the integration node B. The precharge and injection cycle is repeated as many times as necessary, that is to say until the potential at the node B reaches the equilibrium potential $V_{equ}$. These cycles are counted in the counter. It will be noted that, according to this embodiment, the trigger potential, which corresponds to the potential below which an injection of charges is commanded, corresponds to the equilibrium potential $V_{equ}$.

The initialization phase makes it possible to eliminate the effect of the coupling strays automatically. It makes it possible to adapt to the variations that can be encountered on a pixel, namely the technological, thermal, driving variations, as well as the variations due to aging.

Thus, the counter-charge injected on each switchover of the comparator is controlled, the latter being able to be adjusted by setting V_inj_1 and V_inj_2.

The initialization phase can be repeated, for example when the ambient temperature varies, or periodically to guard against aging.

Figure 2B:
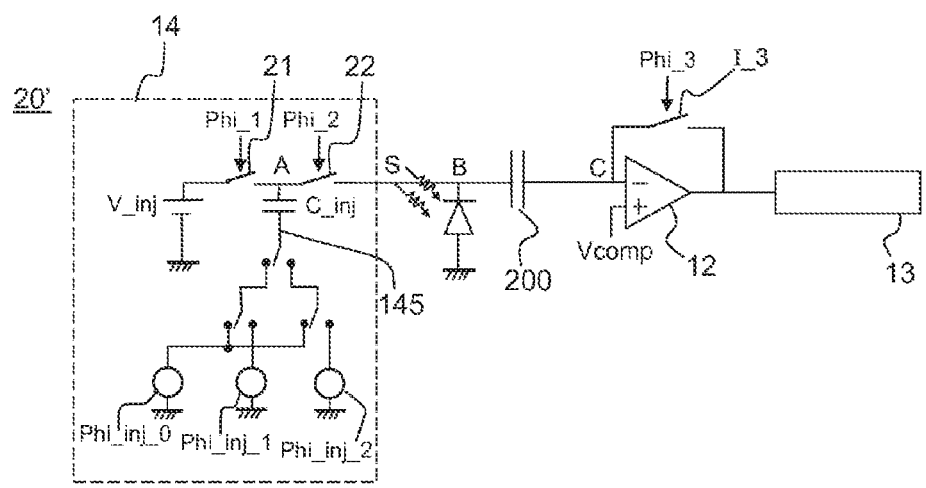

According to a variant of this embodiment, represented on the pixel 20' of FIG. 2B, the injection circuit 14 comprises an input terminal 145 suitable for being switched between:
- a first input potential, equal to Phi_inj_1 and a base potential Phi_inj_0,
- or a second input potential, equal to Phi_inj_2 and a base potential Phi_inj_0.

Moreover, the injection circuit 14 is connected to a fixed supply potential V_inj. The injection of a charge is obtained by actuating the switch 21, so as to precharge the injection capacitance C_inj, while the input terminal 145 is linked to the base potential Phi_inj_0. When the capacitance C_inj is precharged, the switch 21 is switched off then the switch 22 is switched on; the input terminal 145 is then linked to the first potential Phi_inj_1, allowing for the injection of a first charge Q1 at the output S of the injection circuit 14, which corresponds to the integration node B.

$$Q1=(V\_inj-Vs)\times(C\_inj\times C\_det)/(C\_det+C\_inj)+Qpar+(Phi\_inj\_1-Phi\_inj\_0)\times(C\_inj\times C\_det)/(C\_det+C\_inj).$$

During the initialization phase, as in the preceding embodiment, a plurality of injections of first charges Q1 are performed, until the output potential Vs reaches an equilibrium potential $V_{equ}$. At that moment, the first injected charge Q1, below a predetermined threshold, is considered to be nil. The switch I_3 is then switched off so as to store, at the terminals of the capacitance C2, a difference between the equilibrium potential $V_{equ}$ at the output of the injector (that is to say at the integration node B) and a reference potential, $V_{ref}$, the latter corresponding to the switchover potential $V_{comp\_bascul}$ of the comparator 12.

At the end of this initialization phase, the input terminal 145 is switched between the base potential Phi_inj_0 and the second potential Phi_inj_2, such that the injection circuit 14 is suitable for generating a second charge Q2, such that $$Q2=(V\_inj-Vequ)\times(C\_inj\times C\_det)/(C\_det+C\_inj)+Qpar+(Phi\_inj\_2-Phi\_inj\_0)\times(C\_inj\times C\_det)/(C\_det+C\_inj).$$

As previously observed, knowing that Q1=0 when Vs=$V_{equ}$, $$Q2=(Phi\_inj\_2-Phi\_inj\_1)\times(C\_inj\times C\_det)/(C\_det+C\_inj).$$

It will be noted that the quantity of counter-charges injected Q0=Q2 is independent of Qpar.

As in the preceding example, the trigger potential, which corresponds to the potential below which an injection of charges is commanded, corresponds to the equilibrium potential Vequ.

The switches 21, 22 and 13 are never perfect. They have leakage currents when they are switched off. For the switches 21 and 22, the leakage currents are added to the current from the sensitive element 11. The sensitive element 11 itself has a leakage current generally greater than the leakage currents of the switches. These leakage currents can be eliminated by offset calibrations. The leakage currents of the switches 21 and 22 are thus dealt with simultaneously.

By contrast, the leakage currents of the switch I_3 accumulate at the point C, therefore on one of the foils of the capacitor 200. These leakage currents little-by-little modify the value of the charge accumulated in the capacitor 200 during the initialization phase. When the drift of the value of the counter-charges becomes unacceptable, an initialization cycle must be relaunched. Since it is desirable to space the initialization cycles as far apart as possible, there is every interest in reducing as far as possible the leakage current of the switch I_3.

Figure 3:
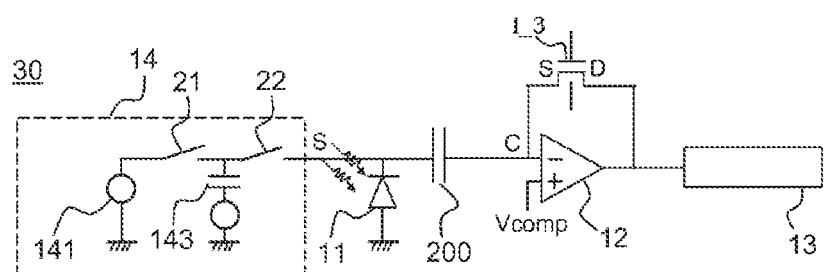
FIG. 3 represents another embodiment of the first variant of an electrical circuit diagram of a pixel in a radiation detector according to the invention.

FIG. 3 represents an electrical circuit diagram of a pixel 30, another embodiment of the first variant presented in FIG. 2A in a radiation detector according to the invention. The electrical circuit diagram of the pixel 30 comprises the same elements as the circuit diagram of the pixel 20 represented in FIG. 2A. The switch I_3 is a transistor of MOS type comprising a gate G, a source S, a drain D. The source S and the drain D form two terminals. A first terminal (in this example the source) is connected to the second input of the comparator 12, and a second terminal (in this example the drain) is connected to the output of the comparator 12. It should be noted that the designations source and drain may be reversed on a feedback-mode MOS transistor of an amplifier.

The leak on the source S can originate from a leak dependent on the source-drain voltage. This voltage is nil at the end of the initialization phase, but then, if the source potential, that is to say the input potential of the comparator 12, moves very little, the drain potential, that is to say the output potential of the comparator 12, by contrast moves a lot as a function of the photocharges detected. The leak can also originate from a leak dependent on the source-substrate voltage.

Figure 4:
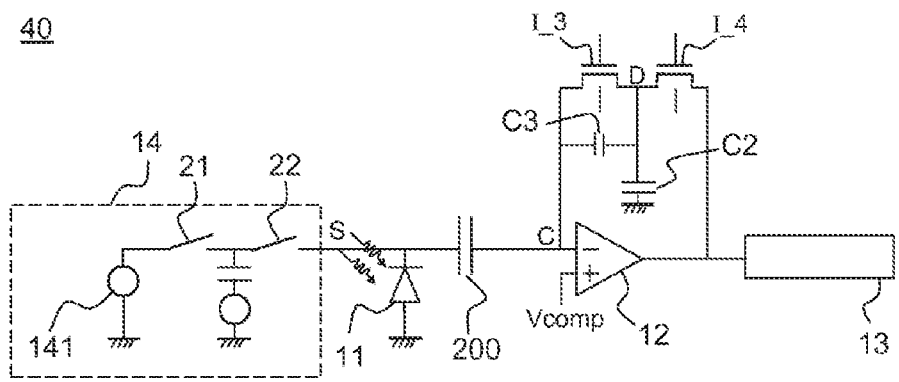
FIG. 4 represents another variant of an electrical circuit diagram of a pixel in a radiation detector according to the invention.

FIG. 4 represents another variant of an electrical circuit diagram of a pixel 40 in a radiation detector according to the invention. The electrical circuit diagram of the pixel 40 comprises the same elements as the circuit diagram of the pixel 30 represented in FIG. 3. It also comprises a switch I_4 connected between the drain D of the switch I_3 and the output of the comparator 12, a capacitor C2 connected between the drain D of the switch I_3 and a fixed voltage, a capacitor C3 connected between the source S and the drain D of the switch I_3.

This variant makes it possible to reduce the leakage current of the switch I_3. During the initialization phase, the switches I_3 and I_4 remain in the on state. The operation remains unchanged relative to the operation corresponding to FIG. 2A. At the end of the initialization phase, the switches I_3 and I_4 are switched off. Preferably, the switch I_3 is switched off before the switch I_4. Before the switch I_3 is switched off, the source and drain voltages of the transistor of MOS type forming the switch I_3 are equal. The switching off of the switch I_3 transforms the setup of the comparator 12 into an integrator setup, the integration capacitor being C3. The stray charge Qpar of the switch I_3 injected at C by the switching off of the switch I_3 is therefore mainly stored on the integration capacitor C3. The stray charge Qpar of the switch I_3 therefore creates almost no disturbance at the node C. As for the disturbance created at the node D, its value is –Qpar/C3. The stray charge Qpar of the switch I_3 being a stray charge, therefore low, the disturbance of the node D is therefore also low, although notably greater than at the node C. The source-drain leakage current of the switch I_3 dependent on the difference of the voltages between C and D is therefore also low.

When I_4 is switched off, the stray charge injected at the node D is stored on C2. If the capacitance of C2 has been chosen to be sufficiently great, then the variation of voltage of the node D is small, and the difference of the voltages between C and D remains low. The source-drain leakage current of the switch I_3 therefore remains low.

Figure 5:
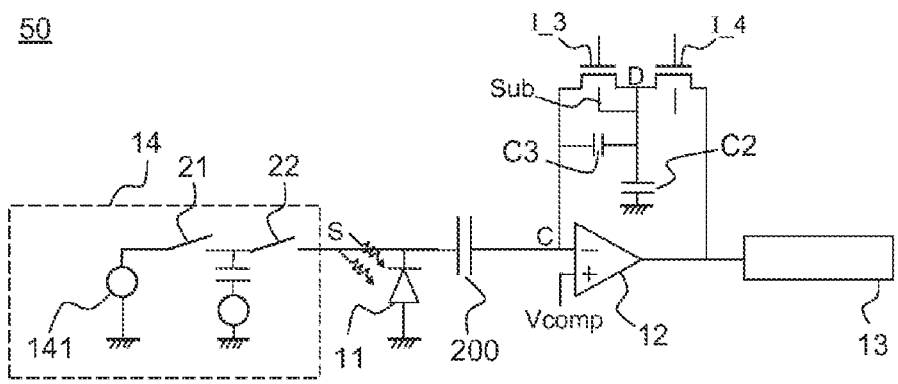
FIG. 5 represents a variant of an electrical circuit diagram of a pixel in a radiation detector according to the invention.

FIG. 5 represents another variant of an electrical circuit diagram of a pixel 50 in a radiation detector according to the invention. The electrical circuit diagram of the pixel 50 comprises the same elements as the circuit diagram of the pixel 40 represented in FIG. 4. The MOS transistor forming the switch I_3 is produced on a substrate Sub, and the substrate Sub is connected to the drain D of the switch I_3. The end of the initialization phase ensures a virtual equality between the voltages at the second input of the comparator 12, at the point D, and $V_{comp\_bascul}$. The voltage between the source S and the drain D of the switch I_3 is reduced, hence a reduction of the leakage currents in the switch I_3. The connection of the substrate Sub of the switch I_3 to the drain D ensures that the source-substrate voltage of the switch I_3 is virtually nil. Because of this, the source-substrate leakage current is limited.

It should be noted that the implementation of the connection of the substrate Sub of the switch I_3 to the capacitor C2 presupposes that the technological method employed for the production of the MOS transistors (and therefore of the switch I_3) allows the substrate Sub of the MOS switch I_3 to be connected as desired. If a P MOS is used, that does not generally pose any problem. Nevertheless, if an N MOS is used, the design rules, dependent on the technological method used, sometimes prevent this connection. The choice of an N or P MOS depends also on the switchover voltage of the comparator 12 that is desired.

Figure 6:
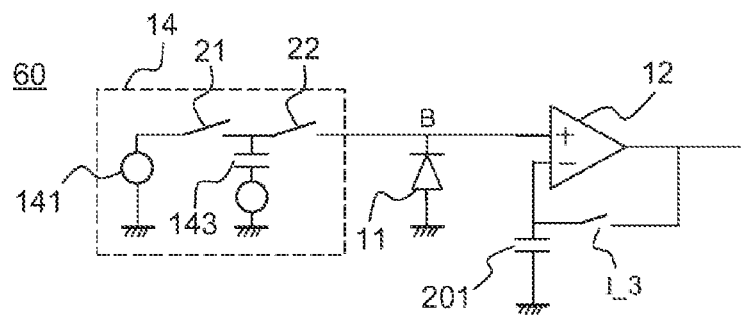
FIG. 6 represents a variant of an electrical circuit diagram of a pixel in a radiation detector according to the invention.

FIG. 6 represents another embodiment of an electrical circuit diagram of a pixel 60 in a radiation detector according to the invention. According to the invention, the injection circuit 14 is linked to the integration node B to which the sensitive element 11 is linked. The injection circuit 14 is suitable for delivering a first charge Q1 or a second charge Q2. The comparator 12 is linked to the integration node B at its positive terminal. The electronic circuit of the pixel 60 further comprises means for setting the inverting input of the comparator 12 at a threshold potential $V_{comp}$ when the integration node reaches an equilibrium potential, and a storage means connected to an input of the comparator 12 suitable for storing the switchover voltage of the comparator 12.

Just as in FIG. 2A, the storage means comprises a capacitor 201 linked to an input of the comparator 12 and a switch I_3 connected between the input of the comparator 12 to which the capacitor 201 is linked and the output of the comparator 12. The capacitor 201 is connected between the negative terminal of the comparator 12 and a fixed voltage, for example the electrical ground.

During an initialization phase, the switch I_3 is in the on state. The switches 21 and 22 of the injection circuit 14 are activated so as to successively inject first charges Q1 at the integration node B, until the potential at the integration node reaches an equilibrium potential $V_{equ}$. The potential of the integration node B no longer changes, that is to say that if the switches 21 and 22 are activated, the charge injected is negligible to within a predetermined threshold.

The equilibrium potential $V_{equ}$ of the integration node B, which corresponds to the potential of the positive terminal of the comparator 12, ends up at the negative terminal of this comparator to within an offset.

The switch I_3 is then switched off. The capacitor 201 then makes it possible to store a difference between an output potential Vs of the injection circuit 14, called equilibrium potential $V_{equ}$, when said first charge is below a predetermined threshold, and a reference potential $V_{ref}$. In this example, the fixed reference potential is the ground.

As in the preceding example, the switchover potential corresponds to the equilibrium potential $V_{equ}$.

With the variant presented in FIGS. 2A to 6, the switchover potential $V_{comp\_bascul}$ of the comparator 12 is fixed and the equilibrium potential $V_{equ}$ at the integration node B is different from the switchover voltage $V_{comp\_bascul}$ of the comparator 12.

With the variant presented in FIG. 6, the threshold voltage $V_{comp}$ of the comparator 12 is variable and is adjusted according to the equilibrium potential $V_{equ}$ at the integration node.

In both cases, a capacitor makes it possible to store the difference between the equilibrium potential $V_{equ}$ at the integration node B and a reference potential, the latter being:

the potential $V_{comp\_bascul}$ in the variant presented in FIGS. 2A to 5, the ground in the variant presented in FIG. 6.

In the variants presented in FIGS. 2A, 2B, 3, 4, 5 and 6, the quantity of charges injected during the initialization phase for the output potential of the injector to reach an equilibrium point depends on the potential difference between the output of the injection circuit 14 and an input terminal (141 or Phi_inj_1) of the injection circuit 14.

In FIGS. 2A to 6, during the phase of use, the quantity of charge injected on each injection of charges depends also on the potential difference between the output of the injection circuit 14 and an input terminal (141 or Phi_inj_1) of the injection circuit 14. However, that is not the case in FIG. 7. In effect, in the variant described in that figure, the charge injection circuit comprises two inputs, and the charge injected depends on the potential differences of each of its inputs. During the initialization phase, an input terminal is linked to the output terminal, whereas, during the phase of use, the output terminal is linked to the integration node, but not to an input terminal.

During the phase of use, the fact that the injection of charges is independent of the output potential makes it possible to overcome the fluctuation of the output potential when the output of the injection circuit is connected to the integration node.

Figure 7:
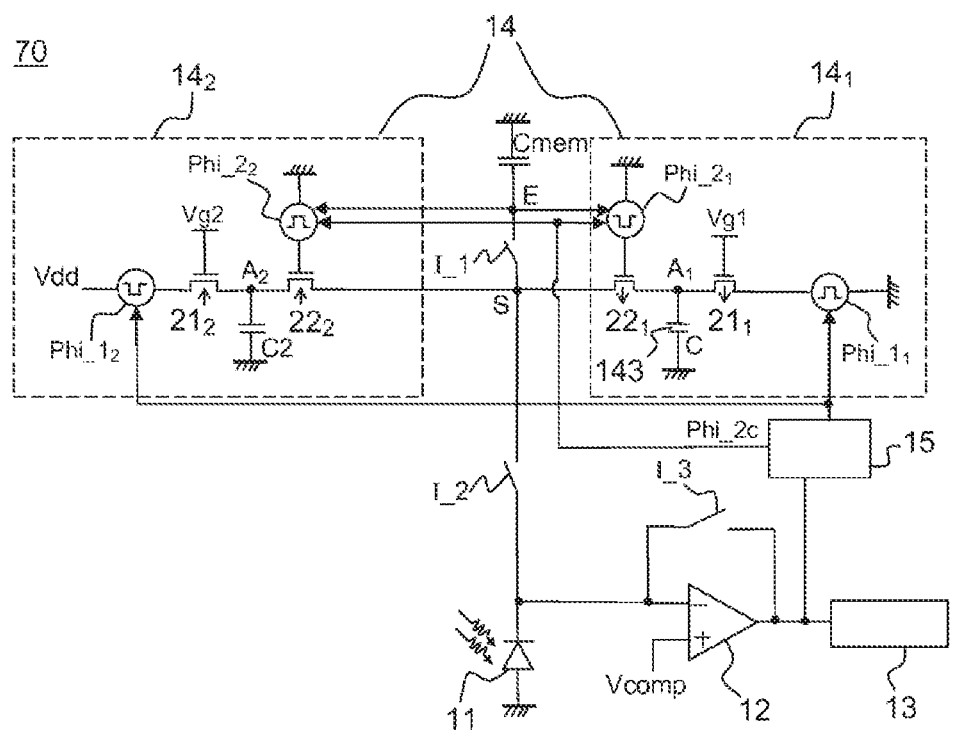
FIG. 7 represents a variant of an electrical circuit diagram of a pixel in a radiation detector according to the invention.

FIG. 7 represents a variant of an electrical circuit diagram of a pixel 70 in a radiation detector according to the invention. The electrical circuit diagram of the pixel 70 comprises the same elements as the circuit diagram of the pixel 10 represented in FIG. 1. According to the invention, and as in the variant presented in FIG. 2A, the injection circuit 14 linked to the integration node B is suitable for delivering a charge Qtot. This injection circuit comprises a first injection circuit $14_1$ and a second injection circuit $14_2$.

The first injection circuit $14_1$, described in the patent application FR2977413, makes it possible to deliver a positive charge at the output point S. It comprises two MOS transistors $21_1$ and $22_1$, of p type, linked to a generator of positive pulses $Phi1_1$. The pulse $Phi1_1$ makes it possible to precharge the injection node $A_1$ of the first injection circuit $14_1$. The transistor $22_1$ is suitable for being activated by a pulse $Phi2_1$, to inject the charge at the output point S. The peak potential of the pulse generator $Phi\_2_1$ corresponds to the potential of the input E.

The injection circuit $14_2$ is a similar circuit, for delivering a negative charge at the output point S. It should be noted that, in the second injection circuit, the MOS transistors $21_2$ and $22_2$ are transistors of n type. The pulse $Phi1_2$ makes it possible to precharge the injection node $A_2$ of the second injection circuit $14_2$. The transistor $22_2$ is suitable for being activated by a pulse $Phi2_2$, to inject the charge at the output point S. The peak potential of the pulse generator $Phi\_2_2$ corresponds to the potential of the input E.

The storage means comprises a capacitor Cmem, a first terminal of which is connected to the node E and the second terminal of which is connected to a reference potential. The storage means also comprises a switch I_1 connected between the node E and the output point S. The node E is equivalent to the integration node B when the switch I_1 is in the on state.

Note that the transistors $22_1$ and $22_2$ are biased in saturation mode: the charge that they deliver does not depend on the potential at the output point S. Moreover, the two injection circuits $14_1$ and $14_2$ comprise a same input terminal E. There is a certain potential of E, for which the charges respectively injected by the first and the second injection circuits ($14_1$ and $14_2$) are canceled out.

The injection circuits $14_1$ and $14_2$ are activated synchronously. To this end, the electronic circuit represented in FIG. 7 also comprises a control circuit 15 so as to trigger a series of charge injections independently of the output of the comparator 12 during the initialization phase.

During the initialization phase, the switch I_1 is in the on state. Thus, the output potential $V_S$ of the injector is equal to the input potential $V_E$ ($V_S=V_E$). A switch I_2, situated between the output of the injector and the integration node B, is preferentially in the off state.

The initialization phase consists in actuating the injection circuits $14_1$ and $14_2$ a series of times. On each injection, the injection node S receives the charge $Qtot_1=C\times(Vg1-V_S)+C2\times(Vg2-V_S)+Qpar$. The charge injected $Qtot_1$ depends on the value of $V_S$:

If $Vs>(C\times Vg1+C2\times Vg2+Qpar)/(C+C2)$, then $Qtot_1<0$, and $V_S$ decreases;

If $Vs<(C\times Vg1+C2\times Vg2+Qpar)/(C+C2)$, then $Qtot_1>0$, and $V_S$ increases;

If $Vs=(C\times Vg1+C2\times Vg2+Qpar)/(C+C2)$, then $Qtot_1=0$, and $V_S$ is constant.

At the end of the initialization phase, an equilibrium value $V_{equ}$ is obtained for $$V_{equ}=(C\times Vg1+C2\times Vg2+Qpar)/(C+C2).$$

This value takes into account the strays or any thermal drift.

The output potential $V_S$ then reaches an equilibrium potential $V_{equ}$, that can be stored at the terminals of the capacitor Cmem by switching off the switch I_1. Thus, the capacitor forms a storage means suitable for storing a potential difference between the equilibrium potential and a reference potential, in this case the ground.

At the end of the initialization phase, the switches I_2 and I_3 are switched on. Thus, $V_B=V_S=V_{comp\_bascul}$. The switch I_3 is then switched off.

During the operation phase, one of the controls (Vg1, Vg2) of a transistor $21_1$ or $21_2$ is adjusted, so that the injector 14 injects a non-nil charge $Qtot_2$ independent of the output potential $V_S$.

Thus, during the operating phase, the charge injected depends only on the equilibrium potential $V_{equ}$ and on the duly modified command potential (Vg1, Vg2). Each command Vg1, respectively Vg2, constitutes an input terminal of the injection circuit $14_1$, respectively $14_2$.

As described previously, during the initialization phase, the voltage at the output node S is left to evolve to find its equilibrium value. In order for this state of equilibrium to be obtained, it is necessary for the sensitive element 11 not to deliver current to this node S. In the case of the variant described in FIG. 7, this is preferentially obtained by switching off the switch 12 during this initialization phase. For the cases of the variants described in FIGS. 2A to 6, a basic solution consists in performing the initialization phase at a moment when the sensitive element 11 is not subjected to the radiation to which it is sensitive. This is in particular possible in radiology when pulsed x-ray emitting tubes are used. Between two irradiation phases corresponding to two successive images, there is a darkness phase that can be exploited to do the initialization.

Nevertheless, for some applications, the irradiation is continuous. Such is the case in radiology when continuous x-ray emitting tubes are used. Such is also the case for a detector of visible or infrared radiation. Furthermore, even in a darkness phase, the current from the sensitive element 11 not being cancelled out does happen. Such is the case for example when there is streaking which can be due to the detector itself or to another element such as a scintillating layer covering a photosensitive element.

The current from the sensitive element 11 must therefore be stopped during the initialization phase.

Figure 8:
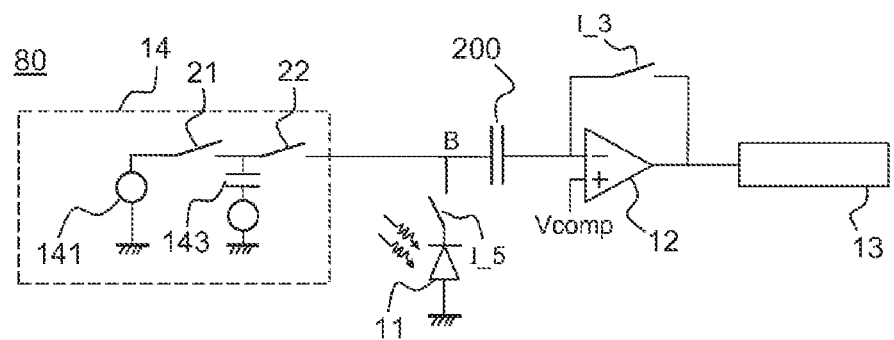
FIG. 8 represents a variant of an electrical circuit diagram of a pixel in a radiation detector according to the invention.

FIG. 8 represents another variant of an electrical circuit diagram of a pixel in a radiation detector according to the invention. The electrical circuit diagram of the pixel 80 comprises the same elements as the circuit diagram of the pixel 20 represented in FIG. 2A. In FIG. 8, the electronic circuit comprises a switch I_5 connected between the sensitive element 11 and the integration node B. Likewise, it is perfectly possible to connect the switch I_5 between the sensitive element 11 and the integration node B in the electrical circuit diagrams of the pixels 20', 30, 40, 50, 60 and 70 represented in FIGS. 2B, 3, 4, 5, 6 and 7.

The initialization phase comprises a preliminary step of disconnection of the sensitive element 11 from the integration node B by means of the switch I_5. During the initialization phase, the switch I_5 is open. It should be noted that the charges created by the illumination while the switch I_5 is open are not lost. They are accumulated on the capacitance of the sensitive element 11 and will return to the integration node B after the end of the initialization phase, after the closure of the switch I_5.

Advantageously, the sensitive element 11 and the switch I_5 can be replaced by a diode that, in the literature, is called a "pinched diode". Also, to be able to work in continuous irradiation mode, it is possible to use a pinched diode provided with an output transistor, also called transfer gate in the literature. Such a pinched diode has a number of advantages. The detection zone and the drain zone on which the charges accumulate are separate. The drain zone is notably less capacitive than in a conventional photodiode for which the capacitive zone corresponds to the detection zone. The electronic circuit in which the pinched diode is incorporated is therefore much more sensitive. When the output transistor is in the off state, the charges accumulate on the detection zone, and the electrical capacitance of the output remains equal to that of the drain zone. It is therefore unchanged. This improves the quality of the initialization phase.

Figure 9:
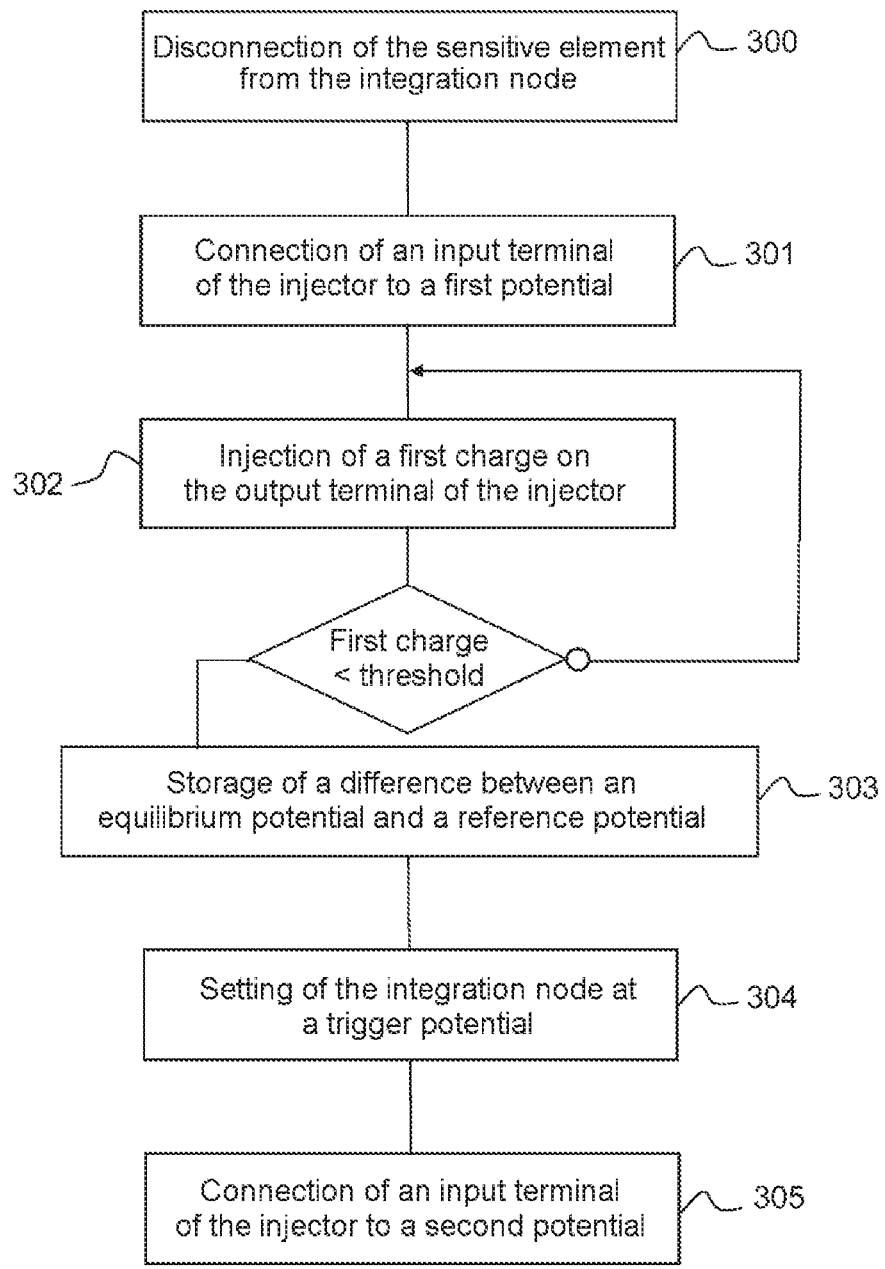
FIG. 9 illustrates the steps of an initialization phase implementing the electronic circuit according to the invention.

FIG. 9 illustrates the steps of an initialization phase implementing the electronic circuit according to the invention. The initialization phase comprises the following steps:

connection of an input terminal of the injector to a first potential (step 301), injection of a first charge on the output terminal of the injector (step 302), storage of a difference between an output potential Vs of the injection circuit 14, called equilibrium potential $V_{equ}$, and a reference potential $V_{ref}$, this storage being performed preferably when said first charge, delivered by the injection circuit, is below a predetermined threshold (step 303), setting of the integration node to a trigger potential (step 304), connection of an input terminal of the injector to a second potential (step 305), such that the injector delivers a second charge as a function of the difference between the potential of the integration node and the trigger potential.

The initialization phase can comprise a preliminary step of disconnection of the sensitive element 11 from the integration node B (step 300).

According to the variant of the electrical circuit diagram of a pixel according to the invention, the injection circuit 14 can inject a first charge (step 302) as a function of the value of the potential of the integration node B, and the switches 21, 22 of the injection circuit 14 are activated a plurality of times (step 301). The plurality is predetermined so that the charges injected reach a value below a predetermined threshold value.

Thus, the initialization phase comprises the injection of a predetermined number of first charges, following which the integration node B reaches an equilibrium potential. In other words, the initialization phase comprises the commanding of a predetermined number N of trigger pulses, such that, after N pulses, said first injected charge is below said predetermined threshold. N can be equal to 1, but generally lies between 10 and 100.

Figure 10:
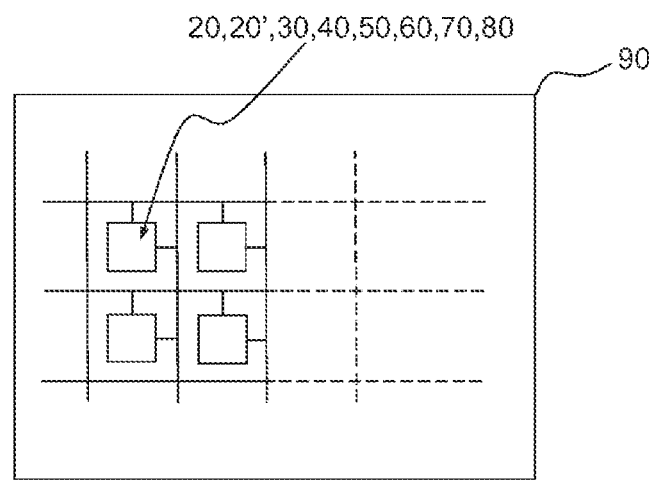
FIG. 10 represents a radiation detector comprising an electronic circuit according to the invention.

FIG. 10 represents a radiation detector 90 comprising an electronic circuit according to the invention. The radiation detector 90 can comprise the electronic circuit 20, 20', 30, 40, 50, 60, 70 or 80 represented in FIGS. 2A, 2B, 3, 4, 5, 6, 7 and 8. The detector can be a matrix detector. The pixels are arranged in rows and in columns to form a matrix. The matrix can comprise a single row. In this case it is called an array.

The counter 13 can be connected at the output of the comparator 12, so as to count the number of times the threshold voltage $V_{comp}$ is crossed by the detection voltage. The counter 13 can also be connected at row end of the matrix or array.

According to a variant, applicable to all the embodiments described previously, during the operating phase of the detector, the quantity of charges delivered by the charge injection circuit 14 is variable.

In other words, the charge injection circuit 14 is adapted to generate a second charge, but also a third charge, different from the second charge.

Thus, during the operating phase, a control means can act on the charge injection circuit, so as to modulate the charge delivered by the injection circuit 14 on each charge injection.

It will be recalled that, at the start of the operating phase, the integration node B is set to a trigger potential, so that, when the integration node B integrates charges generated by the detector, a charge injection is triggered until the potential at the integration node B reaches the trigger potential.

When the detector is used in counting mode, during an interaction, during which the radiation detector collects electrons, the potential at the integration node B drops. As long as the potential of the integration node B is lower than the trigger potential previously established, the circuit commands injections of counter-charges. The number of injection cycles is an indicator of the energy released in the detector by the interaction. A counter 13 makes it possible to count the number of charge injection cycles, which allows for an estimation of the energy.

In such an operation, the charge injected on each cycle must be less than the maximum energy. It can notably be half the maximum energy, even a tenth, even a hundredth, depending on the desired performance level in terms of energy resolution. Typically, a counter-charge equivalent to 100 electrons can be injected on each injection cycle.

When the detector is used in integration mode, the quantity of charges collected by the detector during a given period is accumulated. The number of injection cycles is an indicator of the energy released in the detector during the integration time. A counter makes it possible to count the number of charge injection cycles, which allows for an estimation of the energy collected during the interaction period.

The measurement dynamic range is much greater than in the preceding case, the quantity of charges collected being able to be much greater. In such an embodiment, the counter-charge injected on each integration cycle can be greater, for example 10 times or 100 times greater than that injected when the detector operates in counting mode. The use of a greater counter-charge reduces the number of counter-charge injection cycles, which reduces the consumption, to the detriment of the accuracy of the estimation of the total charge collected by the detector.

Thus, when the aim is to estimate the quantity of charges collected during each interaction (counting mode), the charge injection circuit is configured to inject a second quantity of charges Q2. For that, a switch places an input terminal of the injection circuit at a second potential (V_inj_2, Phi_inj_2).

Figure 2C:
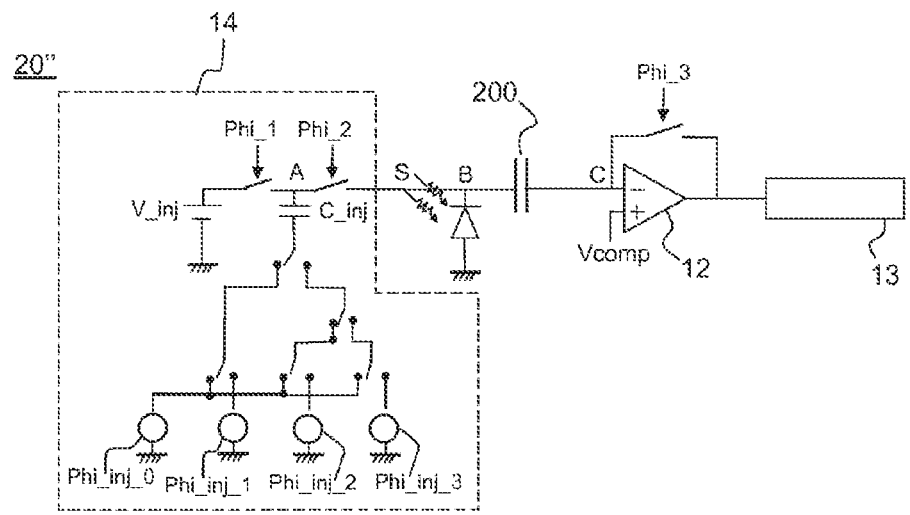

Conversely, when the aim is to estimate the quantity of charges collected by the detector during a given period, the charge injection circuit 14 is configured to inject a third quantity of charges Q3, such that Q3>Q2, as represented in FIG. 2C of the pixel 20". The circuit diagram of FIG. 2C comprises the same elements as the circuit diagram of FIG. 2B. In addition, a switch places an input terminal of the injection circuit 14 at a third potential (V_inj_3 phi_inj_3).

According to a refinement, this switch can act on the counter-charge injection circuit 14 as a function of a number of counter-charge injection cycles stored in the counter 13. The quantity of charge generated by each counter-charge is then modulated as a function of the number of injection cycles recorded in the counter 13.

For example, when the detector operates in integration mode, the circuit can be configured to inject a fourth quantity of charges Q4. For that, a switch places an input terminal of the injection circuit at a fourth potential (V_inj4, Phi_inj4). As long as the number of counter-charge injections has not reached a predetermined threshold, the quantity of charges on each injection amounts to Q3. When the threshold is crossed, the quantity of charges on each injection amounts to Q4, with Q3<Q4. That makes it possible to improve the accuracy of the measurement, particularly for low irradiations.

It has to be stated that such a refinement, according to which, during the operating phase, the injection circuit 14 is suitable for injecting a modulable charge, is compatible with all the embodiments described.

According to another refinement of all the embodiments, this switch can act on the counter-charge injection circuit 14 as a function of the time elapsed since an initial instant, which can correspond to the start of the integration phase. The quantity of charges generated by each counter-charge is then modulated as a function of the time that has elapsed since this initial instant.

Until this time reaches a certain percentage, for example 90%, of the total integration time T, the quantity of charges on each injection amounts to Q3. Beyond, and until the end of the integration period T, the quantity of charges on each injection amounts to Q4. That makes it possible to improve the accuracy of the measurement. According to this refinement, Q4<Q3. It is for example possible to have Q3 and Q4 corresponding respectively to 10,000 and 100 electrons.

For 90% of the integration time, the signal quantity is determined according to a rough accuracy, the accuracy being quantified by the term "Least Significant Bit". At the end of the integration, the accuracy of the measurement is increased.

Thus, during a same integration period, the charge injection circuit is suitable for generating a variable quantity of charges (Q2, Q3, Q4).

Figure 11:
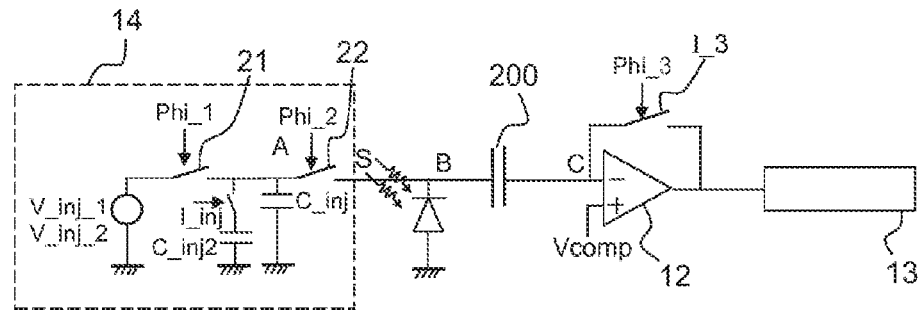
FIG. 11 represents a variant of an electrical circuit diagram of a pixel in a radiation detector according to the invention.

FIG. 11 represents a circuit similar to the circuit represented in FIG. 2A. A second injection capacitance C_inj2 is connected upstream of the integration node A, parallel to the injection capacitance C_inj. It is linked to a switch driven by the command I_inj.

When I_inj is in the off state, the value of the counter-charge injected during each charge injection is equal to:

$$Q2 = (V\_inj\_2 - V\_inj\_1) \times (C\_inj \times C\_det)/(C\_det + C\_inj).$$

When I_inj is in the on state, the value of the counter-charge injected during each charge injection is equal to:

$$Q3 = (V\_inj\_2 - V\_inj\_1) \times ((C\_inj + C\_inj2)(\_det)/(C\_det + C\_inj + C\_inj2).$$

Figure 12:
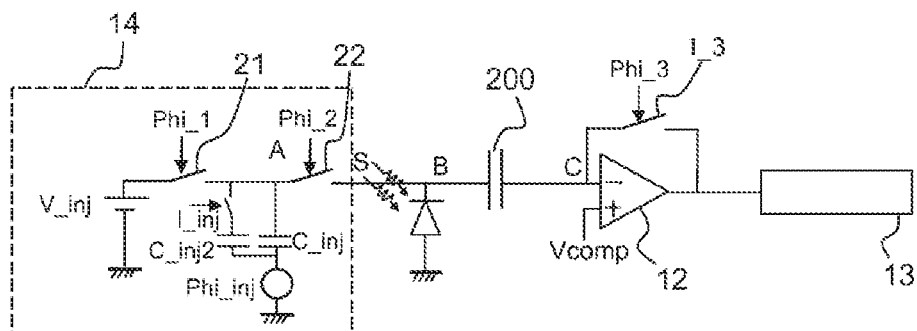
FIG. 12 represents a variant of an electrical circuit diagram of a pixel in a radiation detector according to the invention.

FIG. 12 represents a circuit similar to the circuit represented in FIG. 2B. A second injection capacitance C_inj2 is connected between the input terminal 145 and the injection node A, parallel to the injection capacitance C_inj. It is linked to a switch driven by the command I_inj.

When the switch driven by the command I_inj is in the off state, the value of the counter-charge injected during each charge injection is equal to:

$$Q2 = (Phi\_inj\_2 - Phi\_inj\_0) \times (C\_inj \times C\_det)/(C\_det + C\_inj).$$

When the switch driven by the command I_inj is in the on state, the value of the counter-charge injected during each charge injection is equal to:

$$Q2 = (Phi\_inj\_2 - Phi\_inj\_0) \times ((C\_inj + C\_inj2) \times C\_det)/(C\_det + C\_inj + C\_inj2).$$

Thus, the injection circuit 14 can comprise a second injection capacitance, suitable for being connected to the injection node, which makes it possible to modulate the charge generated by the injection circuit 14.

It will be noted that such an injection circuit does not necessarily require recourse to an initialization phase, in order to establish an equilibrium potential at the output of the injector, corresponding to a negligible charge injection. Likewise, such an injection circuit does not necessarily require a means for storing the equilibrium potential described in relation to FIGS. 1 to 7.

Figure 13:
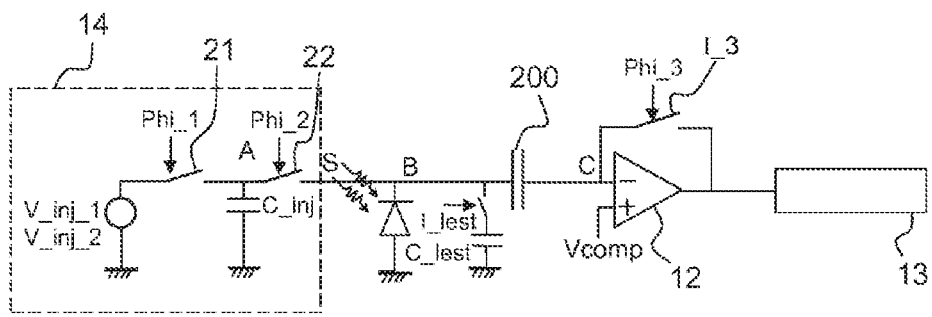
FIG. 13 represents a variant of an electrical circuit diagram of a pixel in a radiation detector according to the invention.

According to another embodiment illustrated in FIG. 13, there is a means for modulating the apparent capacitance of the detector C_det. It can notably be a capacitance called ballast capacitance and denoted C_lest, arranged parallel to the detector, and suitable for being connected to the integration node B when a switch I_lest is activated. The activation of the switch I_lest increases the apparent capacitance C_app of the detector, the latter taking the value C_app=C_det+C_lest. Conversely, the switching off of the switch I_lest reduces the apparent capacitance C_app of the detector, the latter taking the value C_app=C_det.

Referring to the embodiment represented in FIG. 2A, during each charge injection, the potential at the integration node B varies according to the expression:

$$\Delta V_B = (V\_inj\_2 - V\_inj\_1) \times C\_inj/(C\_det + C\_inj).$$

Similarly, referring to the embodiment represented in FIG. 2B, during each charge injection, the potential at the integration node B varies according to the expression:

$$\Delta V_B = (Phi\_inj\_2 - Phi\_inj\_1) \times C\_inj/(C\_det + C\_inj).$$

It will be noted that the variation of potential at the integration node B changes as a function of the capacitance of the detector. When the detector operates in counting mode, it is preferable, for a given charge injection, for the variation of potential at the point B to be significant, so as to reduce the response time of the comparator. Also, it is preferable for C_det to be low.

When the detector operates in integration mode, the quantity of charge injected can be greater. In order to limit the variation of potential at the point B, it is preferable for C_det to be higher. By activating the switch I_lest, so as to add a capacitance mounted in parallel in relation to the detector, the following is obtained in the configuration represented in FIG. 2A:

$$\Delta V_B = (V\_inj\_2 - V\_inj\_1) \times C\_inj / (C\_app + C\_inj).$$

The addition of the capacitance C_lest makes it possible to control the range of variation of the potential at the integration node. That makes it possible for example to set the potential at the integration node within an acceptable operating range, compatible with the correct operation of the circuit.

The invention claimed is:

1. An electronic circuit for radiation detector comprising:
    a radiation-sensitive element,
    an injection circuit, suitable for injecting a charge at a terminal of the radiation-sensitive element, the injection circuit extending between at least one input terminal and one output terminal, the output terminal being suitable for being connected to said radiation-sensitive element, the injection circuit being suitable for producing a charge under the effect of a trigger pulse,
    a comparator having a switchover potential with a first input receiving a threshold potential and a second input suitable for being connected to an integration node that can store electrical charges generated by the radiation-sensitive element on reception of the radiation, the charges bringing about a variation of a potential at the integration node, the injection circuit being suitable for injecting charges at the integration node on each switchover of the comparator until the potential at the integration node reaches or exceeds an equilibrium potential,
    wherein the injection circuit is suitable for injecting a first charge when an input terminal is connected to a first input potential and a second charge when an input terminal is connected to a second input potential,
    the electronic circuit comprises a storage means for storing a difference between the equilibrium potential and a reference potential, the equilibrium potential corresponding to an output potential of the injection circuit after one or more injections of the first charge, the reference potential being a fixed potential, the storage means for storing being connected to an input of the comparator, said input being suitable to be connected to an output of the comparator, so that the input of the comparator is connected to the output of the comparator during an injection of the first charge,
    and wherein the injection circuit is suitable for injecting the second charge dependent on the second input potential and on said equilibrium potential.

2. The electronic circuit as claimed in claim 1, further comprising a means for storing said potential difference after a predetermined number of trigger pulses.

3. The electronic circuit as claimed in claim 1, comprising a first switch connected between the radiation-sensitive element and the integration node.

4. The electronic circuit as claimed in claim 3, wherein the storage means comprises:
    a second capacitor linked to the second input of the comparator,
    a third switch connected between the second input of the comparator to which the second capacitor is linked and the output of the comparator.

5. The electronic circuit as claimed in claim 4, wherein the third switch is a transistor of MOS type comprising a gate, a source, a drain, the source and the drain forming two terminals, wherein a first terminal is connected to the second input of the comparator and a second terminal is connected to the output of the comparator, and wherein the electronic circuit comprises:
    a fourth switch connected between the drain of the third switch and the output of the comparator,
    a third capacitor connected between the drain of the third switch and a second fixed voltage,
    a fourth capacitor connected between the two terminals of the third switch.

6. The electronic circuit as claimed in claim 5, wherein the transistor forming the third switch is produced on a substrate, and wherein the substrate is connected to the drain.

7. The electronic circuit as claimed in claim 3, wherein the storage means comprises:
    a fifth capacitor linked to the first input of the comparator,
    a third switch connected between the first input of the comparator to which the fifth capacitor is linked and the output of the comparator.

8. The electronic circuit as claimed in claim 3, comprising a counter connected at the output of the comparator, so as to count the number of switchovers of the comparator.

9. The electronic circuit as claimed in claim 1, wherein the storage means comprises:
    a first capacitor, a first terminal of which is connected to the integration node and a second terminal of which is connected to a reference potential,
    a second switch connected between the integration node and the first terminal of the first capacitor.

10. A matrix detector composed of pixels, wherein each pixel comprises an electronic circuit as claimed in claim 1.

11. A method implementing the electronic circuit as claimed in claim 1, the method comprising an initialization phase, comprising the following steps:
    connection of an input terminal of the injection circuit to a first potential,
    injection of a first charge on the output terminal of the injection circuit,
    connection of the input terminal of the comparator, connected to the storage means for storing, to the output terminal of the comparator,
    storage of a difference between an equilibrium potential and a reference potential, the equilibrium potential corresponding to an output potential of the injection circuit after one or more injections of the first charge, the reference potential $V_{ref}$ being a fixed potential,
    setting of the integration node to a trigger potential, the trigger potential corresponding to a threshold of the potential of the integration node beyond which the injection circuit injects charges,
    connection of an input terminal of the injection circuit to a second potential, such that the injection circuit delivers a second charge as a function of the difference between the potential of the integration node and the trigger potential.

12. The method as claimed in claim 11, wherein the initialization phase comprises the injection of a predetermined number of first charges, following which the integration node reaches an equilibrium potential.

13. The method as claimed in claim 12, wherein the equilibrium potential corresponds to the potential at the integration node after an initialization phase, said equilibrium potential then constituting the trigger potential, below or beyond which the injection circuit delivers a second charge.

14. The method as claimed in claim 11, wherein said potential difference between said equilibrium potential and the reference potential is stored at the terminals of a link capacitor, said capacitor being arranged between the integration node of the detector and the second input of the comparator.

\* \* \* \* \*